(12) United States Patent
Howell et al.

(10) Patent No.: US 9,080,519 B2
(45) Date of Patent: Jul. 14, 2015

(54) ENGINE OFF TIME TRACKING

(75) Inventors: Clayton M. Howell, Whiteland, IN (US); William D. Meyer, Columbus, IN (US)

(73) Assignee: Cummins IP, Inc., Minneapolis, MN (US)

( * ) Notice: Subject to any disclaimer, the term of this patent is extended or adjusted under 35 U.S.C. 154(b) by 688 days.

(21) Appl. No.: 13/464,804

(22) Filed: May 4, 2012

(65) Prior Publication Data

US 2013/0297176 A1 Nov. 7, 2013

(51) Int. Cl.
F02D 41/24 (2006.01)
F02D 28/00 (2006.01)
G01R 31/00 (2006.01)
F02D 41/04 (2006.01)

(52) U.S. Cl.
CPC .............. *F02D 28/00* (2013.01); *F02D 41/24* (2013.01); *F02D 41/042* (2013.01); *F02D 41/249* (2013.01); *G01R 31/005* (2013.01)

(58) Field of Classification Search
CPC ... F02D 41/24; F02D 41/2403; F02D 41/249; F02D 41/021; F02D 41/042; F02D 41/061; F02D 41/064; G01R 31/005; G01R 31/006; G01R 31/007
USPC ................ 123/102, 107, 115, 198 D, 198 DB
See application file for complete search history.

(56) References Cited

U.S. PATENT DOCUMENTS

| | | | |
|---|---|---|---|
| 5,222,469 A * | 6/1993 | Sutton ................... | 123/198 DC |
| 5,317,998 A * | 6/1994 | Hanson et al. ............ | 123/179.4 |
| 5,353,753 A * | 10/1994 | McGrath et al. ......... | 123/73 AD |
| 5,497,330 A * | 3/1996 | Ishida ............................ | 701/114 |
| 5,581,462 A | 12/1996 | Rogers | |
| RE36,437 E * | 12/1999 | Hanson et al. ............. | 123/179.4 |
| 5,999,876 A | 12/1999 | Irons et al. | |
| 6,025,655 A * | 2/2000 | Hopf ............................ | 307/10.2 |
| 6,347,276 B1 * | 2/2002 | Avery, Jr. ...................... | 701/112 |
| 6,564,622 B2 * | 5/2003 | Majkowski et al. ........ | 73/114.01 |
| 6,718,256 B1 * | 4/2004 | Holmes et al. ................ | 701/113 |
| 7,343,504 B2 | 3/2008 | Fernald et al. | |
| 7,499,790 B2 * | 3/2009 | Kohler .......................... | 701/112 |
| 7,873,464 B2 * | 1/2011 | Shartzer et al. ............... | 701/113 |
| 7,962,773 B2 | 6/2011 | Fernald et al. | |
| 8,442,747 B2 * | 5/2013 | Ma et al. ........................ | 701/112 |
| 2005/0113939 A1 * | 5/2005 | Oyama et al. .................. | 700/14 |
| 2007/0010930 A1 * | 1/2007 | Wu et al. ......................... | 701/99 |
| 2007/0186573 A1 * | 8/2007 | Ziehr et al. ...................... | 62/236 |
| 2008/0098986 A1 * | 5/2008 | McKay et al. ................ | 123/396 |
| 2009/0118895 A1 * | 5/2009 | Arakawa .......................... | 701/29 |
| 2010/0179723 A1 * | 7/2010 | Zhang et al. .................... | 701/35 |
| 2013/0033374 A1 * | 2/2013 | Nakajima et al. ............. | 340/466 |
| 2013/0254468 A1 * | 9/2013 | Miyaki .......................... | 711/103 |
| 2013/0311074 A1 * | 11/2013 | Siira .............................. | 701/113 |

* cited by examiner

Primary Examiner — Thomas Moulis

(74) Attorney, Agent, or Firm — Foley & Lardner LLP

(57) ABSTRACT

An approach to tracking the engine off time of a system including an internal combustion engine. A timer apparatus may electrically couple to the engine control unit by way of a power connection that provides electrical power to the timer apparatus from the engine control unit. The timer apparatus may include a monitor module that monitors the power connection. A timer module may begin a time interval in response to the power connection transitioning from a powered state to an unpowered state. The timer module may end the time interval in response to the power connection transitioning from the unpowered state to the powered state. A communication module may communicate the time interval to the engine control unit by switching the power connection between the high state and the low state.

19 Claims, 6 Drawing Sheets

ENGINE OFF TIME TRACKING

FIELD

This disclosure relates to internal combustion engines, and more particularly to determining the amount of time an engine has been off.

BACKGROUND

In certain markets, an engine control module (ECM) needs to know how long the engine in a vehicle has been turned off. For example, onboard diagnostic (OBD) regulations in certain countries may require that the ECM perform cold sensor rationality checks after a certain time period (e.g., 8 hours) of cold soak (i.e., the amount of time between the engine turn off time and the engine start time). In order to determine whether or not to perform the rationality checks, the ECM needs to know the amount of time that has elapsed since the engine was turned off.

One approach to providing the ECM with this information is to include a real time clock (RTC) within the ECM circuitry. Because the RTC needs to run even when the engine is off, a battery is required to power the RTC. If the battery is provided within the ECM, the useful life of the ECM may be reduced since a failure in the battery, or a depletion of the battery, may require that the entire ECM be replaced or serviced. If the battery is external to the ECM, an additional harness may be required, which adds complexity, bulk, and cost to the ECM. Adding an RTC and battery to an ECM not only results in an increase in cost and complexity in markets or for applications that require cold soak tracking, but such cost and complexity is completely excessive in markets or for applications where cold soak tracking is not required or necessary.

Another known approach is to obtain real time information from another component with an RTC by using the vehicle's data bus and a serial data connection of the ECM. For example, the Society of Automotive Engineers (SAE) J1939 is the vehicle bus standard used for communication and diagnostics among vehicle components. The ECM may rely on another module connected to the data bus to provide real time information, which the ECM can then use to obtain cold soak information. However, given the varied configurations of different vehicles, there may be no guarantee that a particular vehicle will have a module that can provide the proper or compatible connections for transmission of real time information to the ECM.

SUMMARY

The subject matter of the present application has been developed in response to the present state of the art, and in particular, in response to the problems and needs in the combustion control system art that have not yet been fully solved by currently available engine control systems. Accordingly, the subject matter of the present application has been developed to provide an apparatus, system, and method for tracking the off time of an engine that overcomes at least some of the shortcomings of prior art engine systems.

In one embodiment, a timer apparatus for an internal combustion engine includes a monitor module configured to monitor a power connection that provides electrical power from an engine control unit for powering the timer apparatus. The timer apparatus may also include a timer module configured to begin a time interval in response to the power connection transitioning from a powered state to an unpowered state. The timer module may also be configured to end the time interval in response to the power connection transitioning from the unpowered state to the powered state. A communication module may communicate the time interval to the engine control unit by switching a connection that connects the timer apparatus and the engine control unit between a high state and a low state. The connection may be the power connection or another switch connection.

The timer apparatus may also include an internal battery and a power management module that powers the timer apparatus from the power connection when the power connection is in the powered state and from the internal battery when the power connection is in the unpowered state. The internal battery may power the timer apparatus while the communication module communicates the time interval to the engine control unit.

Where the connection is the power connection, the apparatus may also include a mode selection module that transitions the timer apparatus to a reduced power mode when the power connection transitions to the unpowered state. The timer module may include a real time clock to determine the time interval, which real time clock may be powered during the reduced power mode.

The subject matter of the present disclosure may be realized as a system that includes an internal combustion engine and an engine control unit that provides control functions for the internal combustion engine. The engine control unit may include one or more power connections that are in a powered state when the internal combustion engine is on, and that are in an unpowered state when the internal combustion engine is off.

The timer apparatus may electrically couple to the engine control unit by one of the power connections, which power connection may provide electrical power for the timer apparatus. The timer apparatus may include a monitor module that monitors the power connection, a timer module that begins the time interval in response to the power connection transition from the powered state to the unpowered state, and that ends the time interval in response to the power connection transitioning from the unpowered state to the powered state. The communication module may communicate the time interval to the engine control unit by switching the power connection between a high state and a low state. The engine control unit may include a receiver module to receive and interpret the time interval from the communication module.

The subject matter of the present disclosure may be realized as a method that includes monitoring the state of the internal combustion engine, beginning the time interval when the internal combustion engine transitions from the on state to the off state, and that ends the time interval when the internal combustion engine transitions from the off state to the on state. The method may also involve switching the connection between the time apparatus and the engine control unit between a high state and a low state to communicate the time interval to the engine control unit when the internal combustion engine transitions from the off state to the on state.

The described features, structures, advantages, and/or characteristics of the subject matter of the present disclosure may be combined in any suitable manner in one or more embodiments and/or implementations. In the following description, numerous specific details are provided to impart a thorough understanding of embodiments of the subject matter of the present disclosure. One skilled in the relevant art will recognize that the subject matter of the present disclosure may be practiced without one or more of the specific features, details, components, materials, and/or methods of a particular embodiment or implementation. In other instances, additional features and advantages may be recognized in certain embodiments and/or implementations that may not be present in all embodiments or implementations. Further, in some instances, well-known structures, materials, or operations are not shown or described in detail to avoid obscuring aspects of the subject matter of the present disclosure. The features and advantages of the subject matter of the present disclosure will become more fully apparent from the following description and appended claims, or may be learned by the practice of the subject matter as set forth hereinafter.

BRIEF DESCRIPTION OF THE DRAWINGS

In order that the advantages of the subject matter may be more readily understood, a more particular description of the subject matter briefly described above will be rendered by reference to specific embodiments that are illustrated in the appended drawings. Understanding that these drawings depict only typical embodiments of the subject matter and are not therefore to be considered to be limiting of its scope, the subject matter will be described and explained with additional specificity and detail through the use of the drawings, in which.

DETAILED DESCRIPTION

Reference throughout this specification to "one embodiment," "an embodiment," or similar language means that a particular feature, structure, or characteristic described in connection with the embodiment is included in at least one embodiment of the present disclosure. Appearances of the phrases "in one embodiment," "in an embodiment," and similar language throughout this specification may, but do not necessarily, all refer to the same embodiment. Similarly, the use of the term "implementation" means an implementation having a particular feature, structure, or characteristic described in connection with one or more embodiments of the present disclosure, however, absent an express correlation to indicate otherwise, an implementation may be associated with one or more embodiments.

Figure 1:
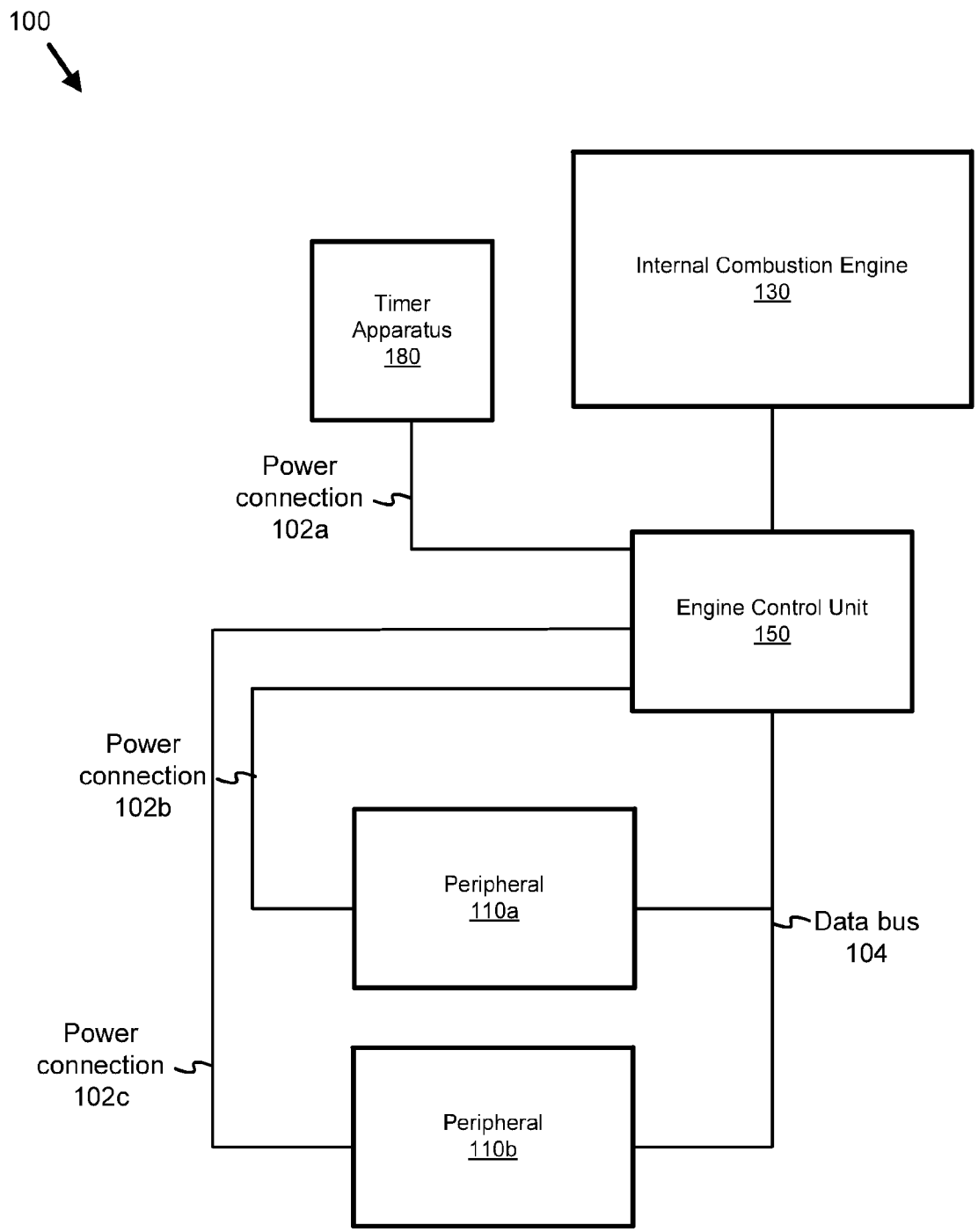
FIG. 1 is a schematic block diagram of one embodiment of a system including an internal combustion engine, an engine control unit, and a timer apparatus.

FIG. 1 depicts one embodiment of a system 100 that includes an internal combustion engine 130, an engine control unit (ECU) 150, a timer apparatus 180, and peripherals 110a-b. The system 100 may form part of a vehicle, such as a car, truck, plane, jet, etc. The system 100 may form part of a non-vehicle, such as a turbine, lawnmower, generator, or other variety of a system that may use an internal combustion engine.

Generally, the internal combustion engine 130 utilizes combustion of a fuel to create energy for powering the particular system 100. The internal combustion engine 130 may use intermittent combustion or continuous combustion. The internal combustion engine 130 may be two-stroke, four-stroke, or other configuration and fueled by gasoline, diesel, alternative fuel, or other fuel based on the particular system 100.

The internal combustion engine 130 is in communication with the ECU 150. The ECU 150 is an electronic device associated with the system 100 that controls operation of the system. For example, in certain implementations, the ECU 130 controls actuation of one or more actuators of the system 100 for proper operation of the system. The ECU 150 provides control functions for the internal combustion engine 130, as well as other sub-systems of the system 100. In a vehicle, the ECU 150 typically receives values from multiple sensors within the system 100 (e.g., the engine 130 and exhaust system of the vehicle), interprets the data received from the sensors, and provides appropriate adjustment of the actuators based on the data and desired operation conditions of the vehicle. For example, based on one or more sensors, the ECU 150 may control the duty cycle of the engine 130 (e.g., the timing of the valves), control the idle speed of the engine, and control the air-to-fuel mixture entering the combustion chambers of the engine, among many other possible control functions.

The peripherals 110a-b are additional electronic devices that provide functionality in the system 100 and that may communicate with the ECU 150. For example, the peripheral 110a may be a transmission control unit, and the peripheral 110b may be an anti-lock braking system (ABS). The peripherals 110a-b may include actuators used to implement the actions determined and commanded by the ECU 150.

The system 100 also includes a data bus 104. The data bus 104 is a communications network that interconnects the ECU 150 with various peripherals 110a-b in the system 100. The data bus 104 may be a specialized bus for use in a vehicle, often referred to as a vehicle bus. For example, the data bus 104 may implement the Society of Automotive Engineers (SAE) J1939 vehicle bus standard used for communication and diagnostics in a vehicle. In some implementations, the data bus 104 may implement a specialized bus that provides assurance of message delivery, assurance of non-conflicting messages, and assured time of delivery that may be important in vehicle settings. The data bus 104 may use a controller area network (CAN) protocol, local interconnect network (LIN) protocol, vehicle area network (VAN), or other protocol. The ECU 150 may share data with the peripherals 110a-b, and the peripherals 110a-b with the ECU 150, using the data bus 104.

The power connections 102a-c provide electrical power for certain apparatus and peripherals of the system 100, such as, for example, the timer apparatus 180 and the peripherals 110a-b. The ECU 150 may control the provisioning of power to the peripherals 110a-b through the power connections 102b-c. The power connections 102a-c may have a powered state (when power is being provided) and an unpowered state (when power is not being provided). In one embodiment, the powered state is a +5 Volts direct current (DC) electrical signal. The unpowered state may be when the power connection 102a-c is at 0 Volts. In certain embodiments, the ECU 150 provides power on the power connections 102a-c when the internal combustion engine 130 is on. When the internal combustion engine 130 is keyed off, the power connections 102a-c may be placed in the unpowered state.

As discussed above, in certain embodiments, the engine control unit 150 may need to know how long the internal combustion engine 130 has been in its OFF state. This information is commonly referred to as the cold soak time period. Under certain regulations, the ECU 150 can be responsible for performing sensor rationality checks if the internal combustion engine 130 has been in the OFF state for over a specified period of time. Accordingly, the timer apparatus 180 of the system 100 marks the period of time that the internal combustion engine 130 has been off. The timer apparatus 180 calculates timing information that represents the period of time that the internal combustion engine 130 has been off, and communicates that timing information to the ECU 150. The timer apparatus 180 may use a real time clock to calculate the timing information. The timer apparatus 180 may be implemented external to the physical form factor of the ECU 150.

The timer apparatus 180, in contrast to the other peripherals 110*a-b*, does not communicate the timing information with the ECU 150 using the data bus 104. Rather, the timer apparatus 180 uses a separate switch connection to communicate the timing information with the ECU 150. As used herein, a switch connection refers to a connection with a high state and a low state, and that is separate from the data bus 104. The switch connection connects components via one or more switch connectors that provide allow the switch connection to couple to the devices. For example, the timer apparatus 180 may have a switch connector and the ECU 150 may have a switch connector, and the switch connection provides the physical connection between the two. The switch connection may comprise one or more insulated wires that allow electrical signals, the form of high and low signals, to be communicated between the two devices. The switch connector may be a female coupling, a male coupling, or other suitable connector for the switch connection.

The power connection 102*a* may be an example of a switch connection. The power connection 102*a* connects the ECU 150 to devices within the system 100. The power connection 102*a* typically has a high signal (when it is in the powered state) and a low signal (when it is in the unpowered state). In one implementation, the timer apparatus 180 communicates timing information to the ECU 150 using the power connection 102*a* by switching the power connection 102*a* between the high state and the low state, as further described below. In this manner, the timer apparatus 180 communicates timing information to the ECU 150 independent of the data bus 104.

Figure 2:
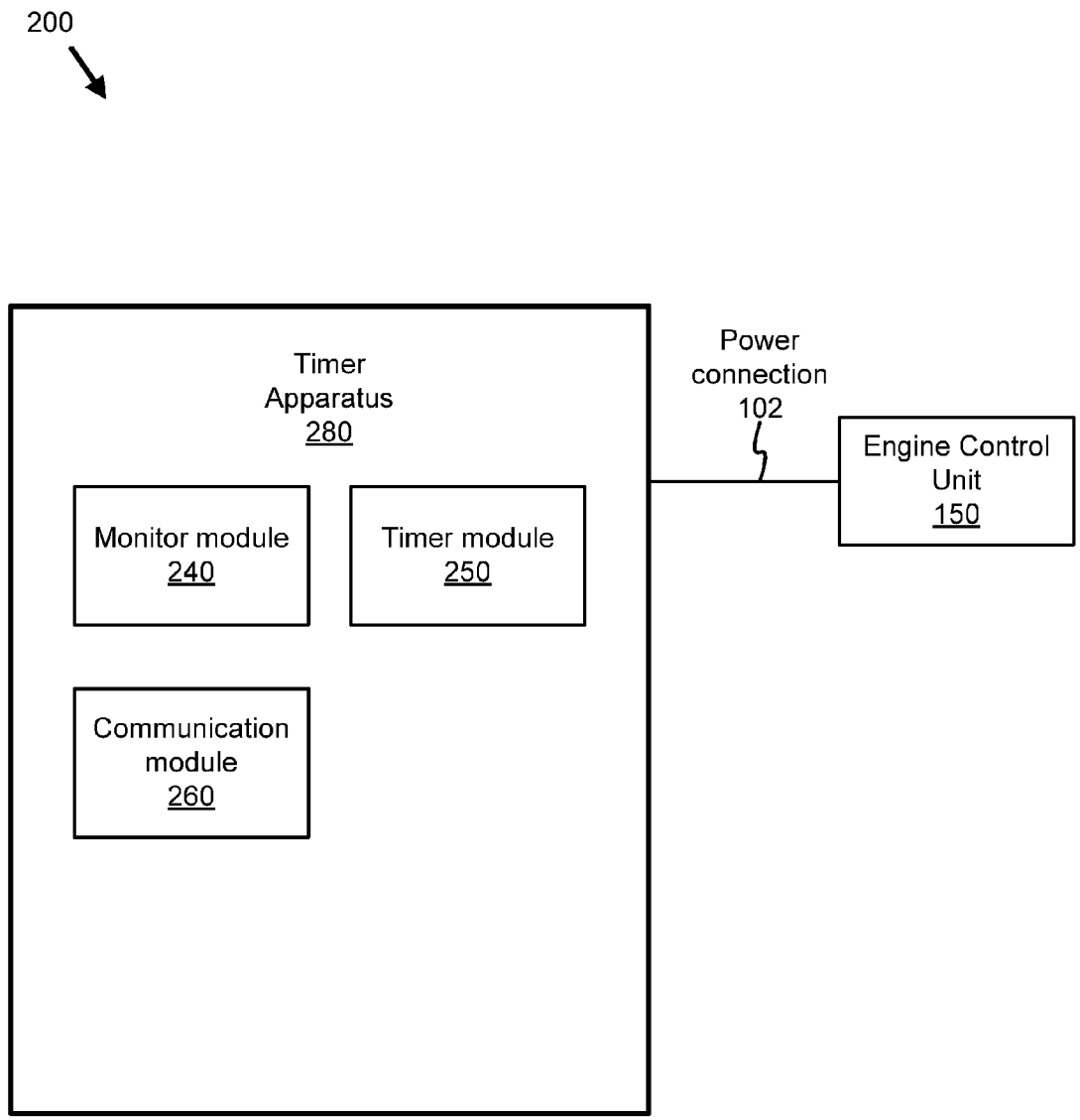
FIG. 2 is a schematic block diagram of a timer apparatus in communication with an engine control unit.

FIG. 2 shows one embodiment of a timer apparatus 280 connected to the engine control unit 150 by a power connection 102. The timer apparatus 280 may have a power connector, through which it receives electrical power, and the ECU 150 may similarly have one or more power connectors, through which it provides electrical power. The timer apparatus 280 includes a monitor module 240, timer module 250, and communication module 260. The timer apparatus 280 may include modules and components other than those shown.

The monitor module 240 is configured to monitor the power connection 102 that provides electrical power from the engine control unit 150 to the timer apparatus 280 for powering the timer apparatus. In certain implementations, the monitor module 240 monitors the state of the power connection 102 to determine whether the power connection 102 is in the powered state or the unpowered state. The monitor module 240 may monitor the state of the power connection 102 by detecting and reporting transitions from one state to the other.

The timer module 250 is configured to begin a time interval in response to the power connection 102 transitioning from the powered state to the unpowered state. The timer module 250 may also be configured to end the time interval in response to the power connection 102 transitioning from the unpowered state back to the powered state. In this manner, in one embodiment, the timer module 250 tracks the period of time that the internal combustion engine 130 is in the OFF state (e.g., the cold soak time period. The ECU 150 transitions the power connection 102 to the unpowered state when the internal combustion engine 130 transitions from an ON state (e.g., starting the engine) to an OFF state (e.g., stopping the engine). Similarly, the ECU 150 transition the power connection 102 to the powered state from the unpowered state when the internal combustion engine 130 transitions from the OFF state to the ON state. In certain embodiments, the timer module 250 may comprise a real time clock (RTC) that is used to track the timing interval.

In certain embodiments, the ECU 150 may remain on and provide power on the power connection 102 for a brief period of time after the internal combustion engine 130 is shut off or stopped in order to perform additional tests or additional actions associated with internal combustion engine 130 being shut off. However, the time difference between the engine being shut off and power supplied to the power connection 102 thereafter being stopped is short enough that the time at which the ECU 150 transitions the power connection 102 to the unpowered state provides a sufficiently adequate approximation of the time at which the internal combustion engine 130 was turned off for purposes of determining the cold soak time period of the internal combustion engine 130.

The communication module 260 is configured to communicate the cold soak time interval determined by the monitor module 240 to the ECU 150 by switching the power connection 102 that connects the timer apparatus 280 and the ECU 150 between the high state and the low state. The communication module 260 may, for example, switch the power connection 102 between a +5V high state, and a 0V low state. The communication module 260 may, in other embodiments, use a different switch connection other than the power connection 102 that is separate from the data bus 104.

In this manner, the timer apparatus 280 may implement a simple solution that provides a cold soak time interval representing the amount of time that the internal combustion engine 130 has been in the OFF state. The ECU 150 may use this information to determine whether additional actions (such as sensor rationality checks) should be performed as part of the startup process for the internal combustion engine 130. The timer apparatus 280 may avoid the complexity, compatibility issues, and cost associated with a design that requires communications over the data bus 104, and also avoid the costs, reduced flexibility, and decreased life expectancy resulting from placing a real time clock (RTC) in the engine control unit 150.

Figure 3:
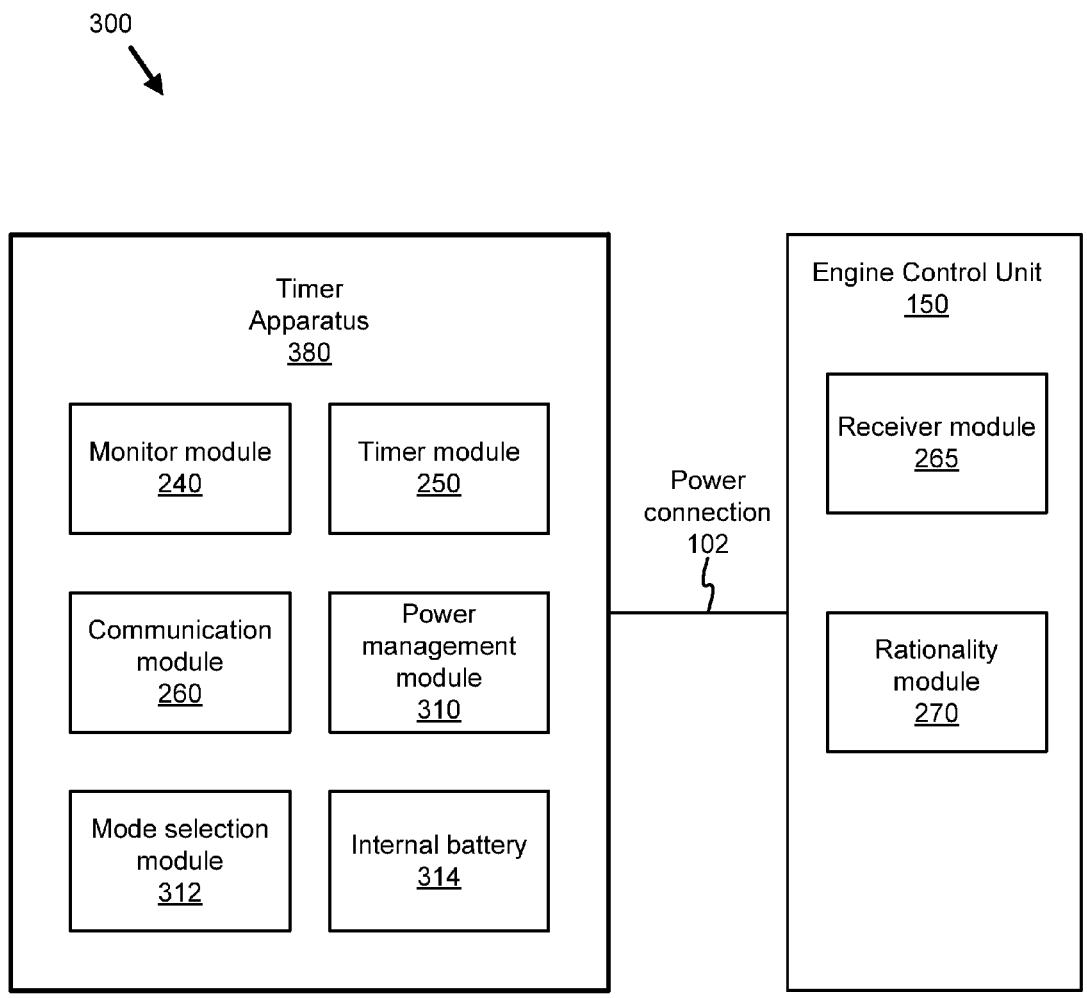
FIG. 3 is another schematic block diagram of timer apparatus in communication with an engine control unit.

FIG. 3 shows another embodiment of a timer apparatus 380 and an engine control unit 150. In FIG. 3, the timer apparatus 380 includes a monitor module 240, a timer module 250, a communication module 260, a power management module 310, a mode selection module 312, and an internal battery 314. FIG. 3 also shows the ECU 150 including a receiver module 265 and a rationality module 270. The monitor module 240, timer module 250, and communication module 260 may perform the same or similar functions as described above in connection with FIG. 2.

The internal battery 314 is a device that converts stored chemical energy into electrical energy. The internal battery 314 may be selected to provide sufficient power to run a real time clock (RTC) in the timer apparatus 380. The internal battery 314 may also be selected to provide sufficient power to run a microcontroller in the timer apparatus 380. In some embodiments, the internal battery 314 is a disposable battery. In other embodiments, the internal battery 314 is a rechargeable battery that is charged when the timer apparatus 380 is receiving electrical power from the engine control unit 150 via the power connection 102. In yet other embodiments, the internal battery 314 includes a combination of both disposable and rechargeable batteries as desired.

The power management module 310 is configured to power the timer apparatus 380 from the power connection 102 when the power connection 102 is in the powered state. The power management module 310 also charges the internal battery 314 when the power connection 102 is in the powered state and internal battery 314 includes a rechargeable battery. The power management module 310 is also configured to power the timer apparatus 380 from the internal battery 314 when the power connection 102 is in the unpowered state. Thus, even though the timer apparatus 380 is not receiving power from an external source, the timer apparatus 380 may continue to operate using the internal battery 314.

In certain embodiments, the power management module 310 may also track the lifespan of the internal battery 314. In the event that the internal battery 314 is failing or approaching the end of its useful life, the power management module 310 may notify the ECU 150 or some OBD indicator that the internal battery 314 has failed or is approaching failure.

As noted above, in certain embodiments, the communication module 260 communicates the time interval to the ECU 150 by switching the power connection 102 between a high state and a low state. In such embodiments, because the power connection 102 is being used for communication purposes, as opposed to power supply purposes, the timer apparatus 380 may be powered by the internal battery 314 while the communication module 260 communicates the time interval. The power management module 310 may, for example, wait until the time interval has been communicated before switching the power source for the timer apparatus 380 from the internal battery 314 to the power connection 102.

The mode selection module 312 may transition the timer apparatus 380 to a reduced power mode in response to the power connection 102 transitioning to the unpowered state. The reduced power mode is a mode of operation for the timer apparatus 380 that reduces the power consumed by the timer apparatus 380. In certain embodiments, components of the timer apparatus 380 that are not required to track the time interval are powered down. The reduced power mode may involve causing a microcontroller in the timer apparatus 380 to operate at a reduced hardware clock speed. Other approaches to reducing power use may also be implemented.

The timer module 250 may include a real time clock (RTC) that is a clock that keeps track of the current time. The RTC may be in the form of an integrated circuit. The RTC may be used by the timer module 250 to determine the time interval. The RTC may be powered by the internal battery 314 during the reduced power mode, thus allowing the timer module 250 to track the time interval when the power connection 102 is in the unpowered state.

The timer module 250 may use a variety of approaches to tracking the time interval. In one embodiment, the timer module 250 notes a start time from the RTC when the power connection 102 transitions to the unpowered state. The timer module 250 may store the start time in nonvolatile memory in the timer apparatus 380. Where the timer module 250 is implemented as part of a microcontroller in the timer apparatus 380, the timer module 250 may shut down after noting the start time. When the power connection 102 transitions back to the powered state, the timer module 250 may be activated and note the end time on the RTC that represents the end of the time interval. The timer module 250 may then note the difference between the start time and the end time and thus determine the time interval. Other methods of using an RTC to calculate a time interval may also be used.

Referring again to FIG. 3, the receiver module 265 of the engine control unit 150 is configured to receive and interpret the time interval communicated by the communication module 260 over the power connection 102. The communication module 260 may send the time interval as a message in accordance with a predefined protocol, as discussed further in connection with FIG. 5. The communication module 260 may communicate the time interval according to a predetermined serial communications protocol. The receiver module 265 is configured to monitor the power connection 102 that connects the engine control unit 150 and the timer apparatus 380 for messages. The ECU 150 may, in response to the internal combustion engine 130 transitioning to the ON state, cause the receiver module 265 to monitor the power connection 102 for a predefined time period in order to receive the time interval. The receiver module 265 may be configured to not monitor the power connection 102 at other times.

The receiver module 265 communicates the time interval received from the communication module 260 to the rationality module 270. The rationality module 270 compares the time interval with a threshold time value. For example, in one embodiment, the threshold time value may be eight hours or some other cold soak time period threshold. The rationality module 270 may be configured to perform one or more rationality checks in response to the time interval being greater than the threshold time value.

Figure 4:
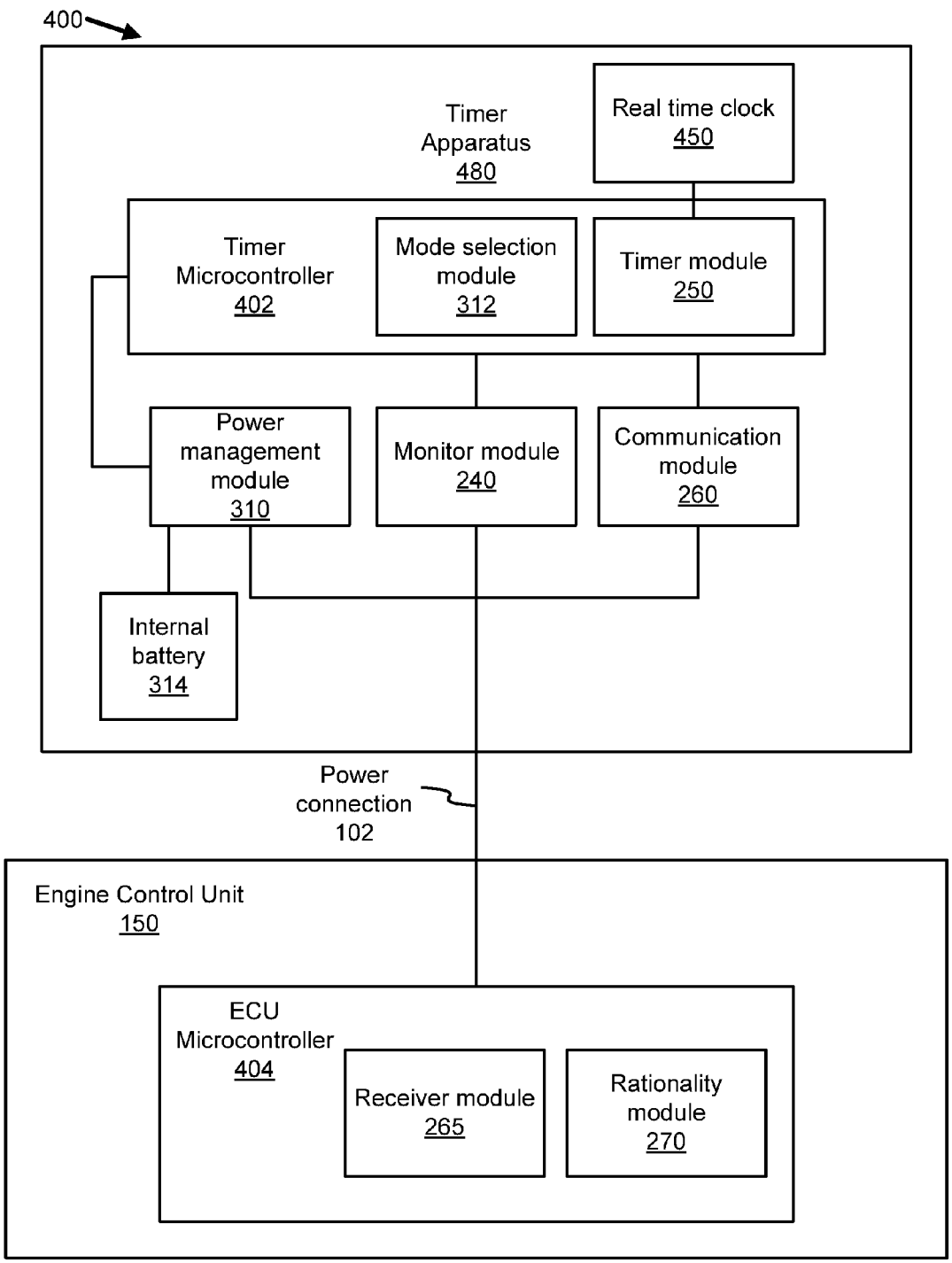
FIG. 4 is a schematic block diagram of one implementation of a timer apparatus and an engine control unit.

FIG. 4 shows one possible implementation of a system 400 including a timer apparatus 480 and an ECU 150. The timer apparatus 480 may include an RTC 450, a timer microcontroller 402, and an internal battery 314. The timer apparatus 480 may also include a timer module 250, a mode selection module 312, a power management module 310, a monitor module 240, and a communication module 260 as discussed above in connection with FIGS. 2 and 3.

In certain embodiments, the timer module 250 may be implemented at least in part in the timer microcontroller 402. The real time clock 450 may be implemented separately from the timer microcontroller 402, but in communication with, the timer microcontroller 402. The power management module 310 may be coupled to the internal battery 314 and the power connection 102, and may select one or the other as the power source for the timer apparatus 480. As noted above, the power management module 310 may use the internal battery 314 to provide power to the timer apparatus 480 while the power connection 102 is in the unpowered state and while the communication module 260 is communicating the time interval to the ECU 150.

The monitor module 240 may include a wake up circuit that wakes up the timer microcontroller 402 in response to the power connection 102 transitioning from the unpowered state to the powered state. The wake up circuit may cause the mode selection module 312 in the timer microcontroller 402 to transition the timer microcontroller 402 from the reduced power mode to the normal power mode.

The communication module 260 may include a protected low side driver that is used to communicate the time interval to the ECM 150. The protected low side driver may use a NPN transistor. The communication module 260 may use the protected low side driver to switch the power connection 102 between the high state and the low state in order to communicate the time interval. In other embodiments, a high side driver may be used.

FIG. 4 also shows the ECU 150 including an ECU microcontroller 404 comprising a receiver module 265 and a rationality module 270. While FIG. 4 shows the receiver module 265 and the rationality module 270 implemented in the ECU microcontroller 404, in certain embodiments, the receiver module 265 and/or the rationality module 270 may be implemented separately from the ECU microcontroller 404, or may be implemented partially within the ECU microcontroller 404 and partially separate from the ECU microcontroller 404. In certain embodiments, the power connection 102 provides power through a switch input to the ECU 150 having a pull-up resistor to +5V DC and a ground return.

Figure 5A:
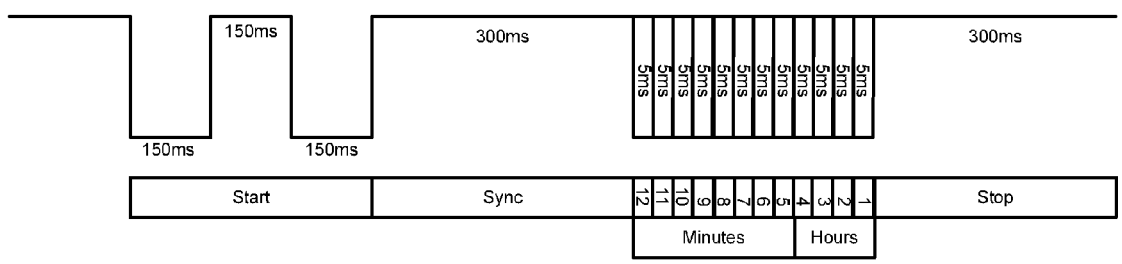
FIGS. 5A and 5B are respective timing diagrams each illustrating one embodiment of a simple protocol for communicating a time interval.

FIG. 5a shows one example of a simple serial communications protocol 500 that may be used to communicate the time interval using the power connection 102 or other switch connection. The protocol 500 may include a starting period that is used to prepare the receiver module 265 to receive the time interval. In one embodiment, the start period comprises a low signal for 150 microseconds, a high signal for 150 microseconds, followed by a low signal for 150 microseconds.

The protocol 500 may also include a sync portion which, in the example shown in FIG. 5a, lasts for 300 milliseconds. The sync period may be followed by communication of the time interval, and a high signal to indicate the end of the time interval. FIG. 5a shows an embodiment where the first eight signals are used to communicate the minutes of the time interval, while the last four signals are used to communicate the hours of the time interval. Other solutions may be implemented; for example, in one embodiment, the protocol 500 may provide for the communication module 260 communicating the start time of the time interval, where the start time consists of the time of day, as reported by the RTC 450, when the time interval began. The protocol 500 may further provide for the communication module 260 communicating the end time of the time interval, where the end time consists of the time of day, as reported by the RTC 450, when the time interval ended. The receiver module 265 may be configured to receive the two times and determine how long the internal combustion engine 130 was in the OFF state. Other methods of transmitting the time interval may also be used, and the protocol 500 may be similarly adjusted to allow for transmitting the time interval appropriately.

Figure 5B:
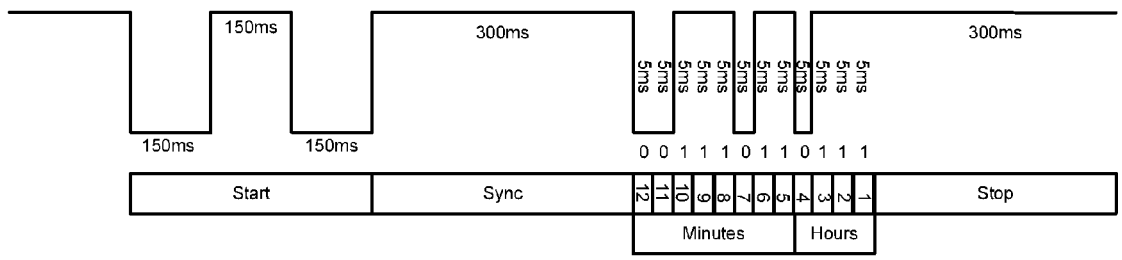

FIG. 5b shows one example of a signal sent by the communication module 260 communicating the time interval to the ECU 150 by switching the power connection 102 between a high state and a low state. As described above, the communication module 260 may use a protected low side driver to switch the power connection 102 according to the protocol 500.

The communication module 260 may switch the power connection 102 to a low state for 150 microseconds, high for 150 microseconds, and low for 150 microseconds as part of a start portion of the protocol 500. The communication module 260 may follow the start period with a 300 microsecond high state sync signal, after which the time interval is communicated. The communication module 260 may use 5 microsecond signals to communicate one binary digit representing a portion of the time interval. In the example shown in FIG. 5b, the communication module 260 switches the power connection 130 between the high and low states at 5 microsecond intervals to communicate a value of 00111011 representing the minutes, and a value of 0111 representing the hours. The time interval may thus be 59 minutes, and seven hours, as represented in the binary digits provided above. In other embodiments, the hour is communicated first, followed by the minutes.

Figure 6:
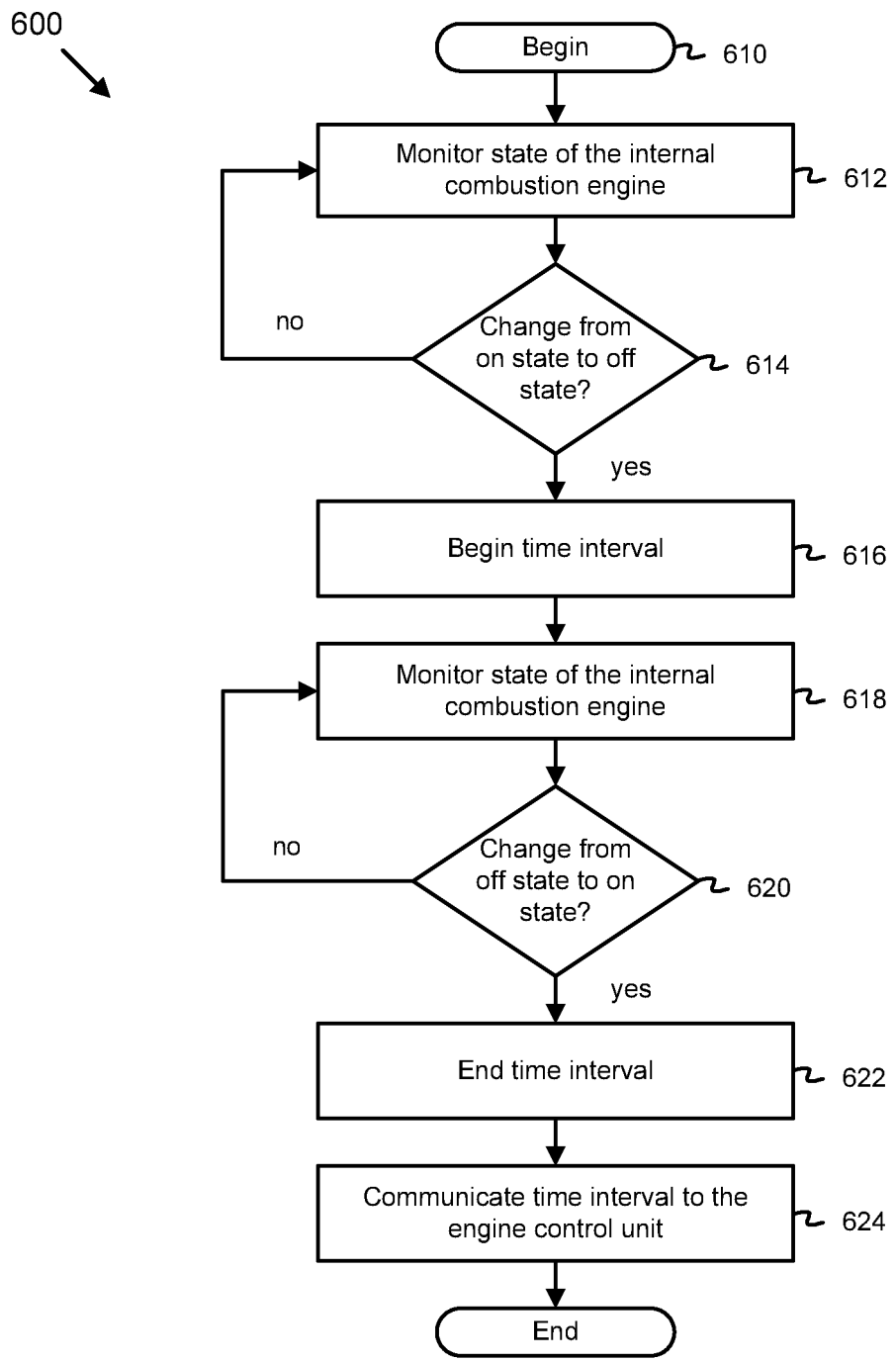
FIG. 6 is a flow chart diagram illustrating one embodiment of a method for determining an off-state time interval for an internal combustion engine.

FIG. 6 shows one embodiment of a method 600 for determining the period of time that the internal combustion engine 130 has been turned off. The method 600 may begin with monitoring 612 the state of the internal combustion engine 130. In certain embodiments, the monitoring is done directly. In other embodiments, the monitoring is done indirectly. For example, as in certain examples given above, the timer apparatus 480 may use the state of the power connection 102 as a suitable and indirect approximation for when the internal combustion engine 130 transitions from an ON state to an OFF state, and from an OFF state to an ON state. While there may be some slight delay between a change in the state of the internal combustion engine 130 and a corresponding change in the state of the power connection 102, the delay may be insignificant given the size of the relevant time intervals.

The method 600 may involve determining 614 whether the state of the internal combustion engine 130 has changed from the ON state to the OFF state. If not, the method 600 may continue with the monitoring step 612. If there is such a change, the method 600 may involve beginning 616 the time interval in response to the internal combustion engine 130 transitioning from the ON state to the OFF state. The monitor module 240 may determine that the internal combustion engine 130 has transitioned from the ON state to the OFF state if the power connection 102 changes from the powered state to the unpowered state.

Once the time interval is begun, the method 600 may involve again monitoring 618 the state of the internal combustion engine 130. In response to determining 620 that the state of the internal combustion engine 130 has changed from the OFF state to the ON state, the method 600 may involve ending 622 the time interval. The monitor module 240 may determine that the internal combustion engine 130 has transitioned from the OFF state to the ON state if the power connection 102 changes from the unpowered state to the powered state.

The method 600 may further involve communicating 624 the time interval representing the period of time for which the internal combustion engine 130 has been in the OFF state to the ECU 150. The communication module 260 may, for example, switch the power connection 102 between the timer apparatus 480 and the ECU 150 between the high state and the low state to communicate the time interval. In response, the ECU 150 may conduct one or more rationality checks if the time interval is greater than a threshold time value.

The method 600 may also involve transitioning the timer apparatus 480 to a low power mode in response to the internal combustion engine 130 transitioning from the ON state to the OFF state, where the low power mode involves powering at least the real time clock 450 from the internal battery 314. The method 600 may also involve powering the timer apparatus 480 from the internal battery 314 in response to determining that the internal combustion engine 130 is in the OFF state, and powering the timer apparatus 480 from the power connection 102 when the internal combustion engine 130 is in the ON state. The method 600 may further involve delaying the transition between the internal battery 314 as the power source for the timer apparatus 480 to the power connection 102, even after the power connection 102 is in the powered state, until after the communication module 260 communicates the time interval.

The schematic flow chart, block, and method diagrams described above are generally set forth as logical flow chart diagrams. As such, the depicted order and labeled steps are indicative of representative embodiments. Other steps and methods may be conceived that are equivalent in function, logic, or effect to one or more steps, or portions thereof, of the methods illustrated in the schematic diagrams. Additionally, the format and symbols employed are provided to explain the logical steps of the schematic diagrams and are understood not to limit the scope of the methods illustrated by the diagrams. Although various arrow types and line types may be employed in the schematic diagrams, they are understood not to limit the scope of the corresponding methods. Indeed, some arrows or other connectors may be used to indicate only the logical flow of a method. For instance, an arrow may indicate a waiting or monitoring period of unspecified duration between enumerated steps of a depicted method. Additionally, the order in which a particular method occurs may or may not strictly adhere to the order of the corresponding steps shown.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in software for execution by various types of processors. An identified module of computer readable program code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of computer readable program code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices, and may exist, at least partially, merely as electronic signals on a system or network. Where a module or portions of a module are implemented in software, the computer readable program code may be stored and/or propagated on in one or more computer readable medium(s).

The computer readable medium may be a tangible computer readable storage medium storing the computer readable program code. The computer readable storage medium may be, for example, but not limited to, an electronic, magnetic, optical, electromagnetic, infrared, holographic, micromechanical, or semiconductor system, apparatus, or device, or any suitable combination of the foregoing.

More specific examples of the computer readable medium may include but are not limited to a portable computer diskette, a hard disk, a random access memory (RAM), a read-only memory (ROM), an erasable programmable read-only memory (EPROM or Flash memory), a portable compact disc read-only memory (CD-ROM), a digital versatile disc (DVD), an optical storage device, a magnetic storage device, a holographic storage medium, a micromechanical storage device, or any suitable combination of the foregoing. In the context of this document, a computer readable storage medium may be any tangible medium that can contain, and/or store computer readable program code for use by and/or in connection with an instruction execution system, apparatus, or device.

The computer readable medium may also be a computer readable signal medium. A computer readable signal medium may include a propagated data signal with computer readable program code embodied therein, for example, in baseband or as part of a carrier wave. Such a propagated signal may take any of a variety of forms, including, but not limited to, electrical, electro-magnetic, magnetic, optical, or any suitable combination thereof. A computer readable signal medium may be any computer readable medium that is not a computer readable storage medium and that can communicate, propagate, or transport computer readable program code for use by or in connection with an instruction execution system, apparatus, or device. Computer readable program code embodied on a computer readable signal medium may be transmitted using any appropriate medium, including but not limited to wireless, wireline, optical fiber cable, Radio Frequency (RF), or the like, or any suitable combination of the foregoing In one embodiment, the computer readable medium may comprise a combination of one or more computer readable storage mediums and one or more computer readable signal mediums. For example, computer readable program code may be both propagated as an electro-magnetic signal through a fiber optic cable for execution by a processor and stored on RAM storage device for execution by the processor.

Computer readable program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The computer readable program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The present subject matter may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A timer apparatus for an internal combustion engine, comprising:
   a monitor module configured to monitor a power connection that provides electrical power from an engine control unit for powering the timer apparatus;
   a timer module configured to begin a time interval in response to the power connection transitioning from a powered state to an unpowered state, and further configured to end the time interval in response to the power connection transitioning from the unpowered state to the powered state; and
   a communication module configured to communicate the time interval to the engine control unit by switching a connection connecting the timer apparatus and the engine control unit between a high state and a low state, wherein the connection is one of the power connection and a second switch connection.

2. The apparatus of claim 1, wherein the communication module communicates the time interval by switching the power connection.

3. The apparatus of claim 1, further comprising:
an internal battery; and
a power management module configured to power the timer apparatus from the power connection in response to the power connection being in the powered state, and further configured to power the timer apparatus from the internal battery in response to the power connection being in the unpowered state.

4. The apparatus of claim 1, wherein the timer apparatus is powered by an internal battery while the communication module communicates the time interval to the engine control unit.

5. The apparatus of claim 1, wherein the connection is the power connection, the apparatus further comprising a mode selection module configured to transition the timer apparatus to a reduced power mode in response to the power connection transitioning to the unpowered state.

6. The apparatus of claim 5, the timer module further comprising a real time clock, wherein the timer module utilizes the real time clock to determine the time interval.

7. The apparatus of claim 6, wherein the real time clock is powered during operation of the timer apparatus in a reduced power mode.

8. A system comprising:
an internal combustion engine;
an engine control unit configured to provide control functions for the internal combustion engine, the engine control unit comprising one or more power connections that are in a powered state in response to the internal combustion engine being on and that are in an unpowered state in response to the internal combustion engine being off;
a timer apparatus electrically coupled to the engine control unit by one power connection that provides electrical power for the timer apparatus from the engine control unit, the timer apparatus further comprising:
a monitor module configured to monitor the power connection;
a timer module configured to begin a time interval in response to the one power connection transitioning from the powered state to the unpowered state, and further configured to end the time interval in response to the one power connection transitioning from the unpowered state to the powered state; and
a communication module configured to communicate the time interval to the engine control unit by switching the one power connection between a high state and a low state.

9. The system of claim 8, the engine control unit further comprising a receiver module configured to receive and interpret the time interval from the communication module.

10. The system of claim 8, further comprising a power management module configured to power the timer apparatus from the power connection in response to the one power connection being in the powered state, and to power the timer apparatus from an internal battery in response to the one power connection being in the unpowered state.

11. The system of claim 8, wherein the communication module communicates the time interval to the engine control unit by switching the one power connection between the high state and the low state according to a predefined message format.

12. The system of claim 8, the engine control unit further comprising a rationality module configured to perform one or more rationality checks in response to the time interval being greater than a threshold time value.

13. The system of claim 8, wherein the communication module communicates the time interval according to a predetermined serial communications protocol.

14. A method comprising:
monitoring a state of an internal combustion engine;
beginning a time interval in response to the internal combustion engine transitioning from an on state to an off state;
ending the time interval in response to the internal combustion engine transitioning from the off state to the on state; and
switching a connection between a timer apparatus and an engine control unit between a high state and a low state to communicate the time interval to the engine control unit in response to the internal combustion engine transitioning from the off state to the on state.

15. The method of claim 14, further comprising transitioning the timer apparatus to a low power mode in response to the internal combustion engine transitioning from the on state to the off state.

16. The method of claim 15, wherein the low power mode comprises powering a real time clock from an internal battery in the timer apparatus.

17. The method of claim 14, further comprising powering the timer apparatus from an internal battery in response to the internal combustion engine being in the off state.

18. The method of claim 17, further comprising powering the timer apparatus from the internal battery while switching the connection between the high state and the low state to communicate the time interval to the engine control unit.

19. The method of claim 18, further comprising powering the timer apparatus from the connection in response to the internal combustion engine being in the on state.

* * * * *